United States Patent [19]

Wonsowicz et al.

[11] Patent Number: 4,597,989
[45] Date of Patent: Jul. 1, 1986

[54] METHOD OF DEPOSITING SILICON FILMS WITH REDUCED STRUCTURAL DEFECTS

[75] Inventors: Casimir J. Wonsowicz; Glenn R. Canfield, both of San Diego, Calif.

[73] Assignee: Burroughs Corporation, Detroit, Mich.

[21] Appl. No.: 635,833

[22] Filed: Jul. 30, 1984

[51] Int. Cl.[4] ............................................... B08B 9/00
[52] U.S. Cl. ........................................ 427/99; 427/86; 134/22.18; 134/37
[58] Field of Search .................... 427/99, 348, 350, 86; 118/70; 134/22.12, 22.18, 37; 15/304, 316 R, 345

[56] References Cited

U.S. PATENT DOCUMENTS 4,138,306  2/1979  Niwa ..................................... 156/345
4,500,492  2/1985  Yamakawa ........................... 422/199

Primary Examiner—John D. Smith
Assistant Examiner—K. E. Jaconetty
Attorney, Agent, or Firm—Charles J. Fassbender; Kevin R. Peterson

[57] ABSTRACT

Silicon films in integrated circuits are mass produced with reduced structural defects by passing a reactant gas which contains silicon over a batch of wafers in a quartz chamber to deposit a silicon substance on both the wafers in a quartz chamber and the quartz walls of the chamber; repeating the passing step on other batches of wafers until the thickness of the silicon substance on the quartz walls exceeds a predetermined limit; directing a forceful stream of gas against the quartz walls to knock microscopic particles of the silicon substance therefrom; removing the knocked-off microscopic particles from the chamber; and continuing the passing and repeating steps with no intervening acid etch of the silicon substance on the quartz walls.

11 Claims, 6 Drawing Figures

METHOD OF DEPOSITING SILICON FILMS WITH REDUCED STRUCTURAL DEFECTS

BACKGROUND OF THE INVENTION

This invention relates to methods of depositing films of a silicon substance, such as silicon nitride and polycrystalline silicon, on integrated circuit wafers; and more particularly, it relates to methods of mass producing such films in a quartz chamber with improved structural uniformity and reduced defects.

As is well known, an integrated circuit is made by depositing and patterning films of several different materials on top of each other in layers on a silicon wafer. One of these films is often made of silicon nitride. It is used to insulate one conducting layer from another. Also, it is used as a mask for an ion implant step and as a mask for a selective oxidation step.

Another common film of material in an integrated circuit is made of polycrystalline silicon. It is generally used as a conductor; and it is made conductive by being doped with phosphorus. Doped polycrystalline silicon is used, for example, as a gate in field effect transistors.

However, if microscopic imperfections occur in the structure of such films during their fabrication, then the integrated circuit into which they are incorporated may be rendered inoperable. For example, a small pinhole in a silicon nitride film that is used as an insulator between two conductors can result in a short between those conductors.

Likewise, a small pinhole in a silicon nitride film that is used as a mask for an ion implant step or an oxidation step can respectively result in an unintended portion of the circuit being implanted or oxidized through the pinhole. Structural imperfections in polycrystalline silicon films also cause integrated circuit malfunctions.

When films of silicon nitride or polycrystalline silicon are deposited on integrated circuit wafers in a deposition chamber, it is known that the same silicon substance is also deposited on the internal walls of the chamber. Thus in a mass production environment where multiple batches of wafers are processed one after the other in the same chamber, the silicon substance on the internal walls builds up. This film must be periodically removed from the chamber walls before it gets too thick; otherwise it will flake off and cause microscopic structural imperfections in the film that is being deposited on the wafers.

In the semiconductor industry, the chambers in which the silicon nitride and polycrystalline silicon films are deposited are almost always made of quartz. Such quartz chemical vapor deposition chambers are available from National Quartz Corporation of Orange, California and Quartz International Corporation of Santa Clara, California. One reason for using quartz is that silicon nitride and polycrystalline silicon films adhere quite well to quartz; and thus the number of batches of wafers that can be processed before the depositin chamber needs a cleaning is maximized.

In the past, it has been a standard practice in the semiconductor industry to remove films of silicon nitride and polycrystalline silicon from the internal walls of the quartz deposition chamber by means of an acid etch. However, as the present invention teaches, such a removal step has some serious side effects that prevent the number of defects in the deposited films from being as small as the present invention achieves.

Accordingly, a primary object of the invention is to provide a method of mass producing films of silicon nitride and polycrystalline silicon with greatly reduced numbers of structural defects.

BRIEF SUMMARY OF THE INVENTION

In accordance with the present invention, the above object and others are achieved by the steps of: passing a reactant gas which contains silicon over a batch of wafers in a quartz chamber to deposit a silicon substance on both the wafers and the quartz walls of the chamber; repeating the passing step on other batches of wafers until the thickness of the silicon substance on the quartz walls exceeds a predetermined limit; directing a forceful stream of gas against the quartz walls to knock microscopic particles of the silicon substance therefrom; removing the knocked-off microscopic particles from the chamber; and continuing the passing and repeating steps with no intervening acid etch of the silicon substance on the quartz walls.

BRIEF DESCRIPTION OF THE DRAWINGS

Various features and advantages of the invention are described in the Detailed Description in conjunction with the accompanying drawings wherein.

DETAILED DESCRIPTION OF THE INVENTION

Figure 1:
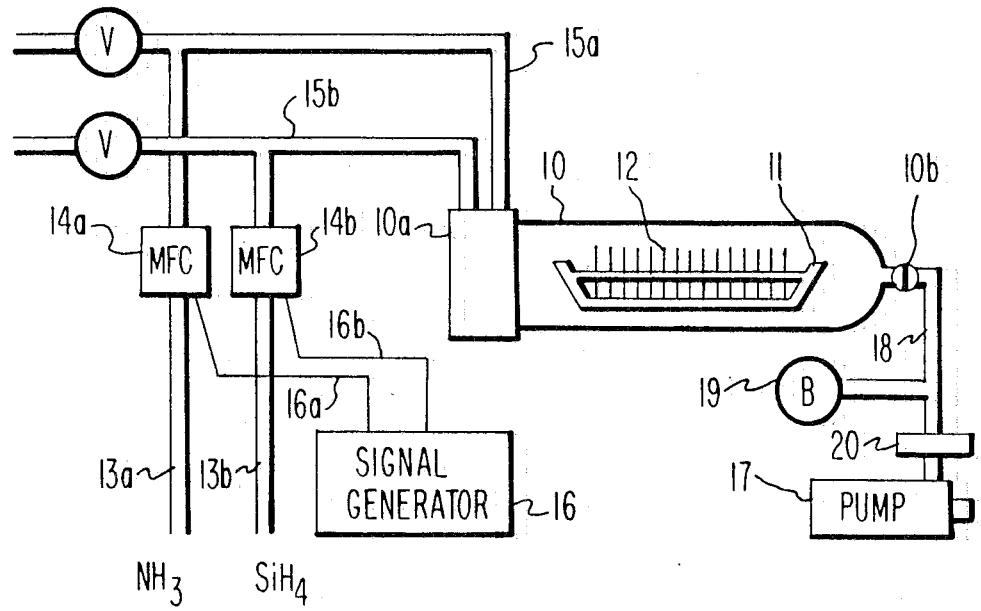
FIG. 1 illustrates a system in which silicon films are deposited in accordance with the steps of the invention.

Referring now to FIG. 1, a system in which silicon nitride films are deposited in accordance with the steps of the invention will be described. This system includes a quartz deposition chamber 10 containing one or more boats 11 that hold a plurality of wafers 12 on which silicon nitride is deposited. Each boat contains one hundred eighty wafers spread three thirty-seconds of an inch apart, with several "dummy" wafers (e.g., five) placed in each end of the boat. All of the wafers on all of the boats that are in chamber 10 during a single deposition process are herein referred to as one batch.

Various gases that are used to grow the film on the batch of wafers are introduced into chamber 10 at one end 10a and are removed therefrom at an opposite end 10b. Those gases consist of $NH_3$ and $SiH_4$. Prior to entering chamber 10, the gases pass through respective tubes 13a and 13b which lead into respective mass flow controllers 14a and 14b. From the mass flow controllers, the $NH_3$ gas passes through a tube 15a into chamber 10 while the $SiH_4$ gas passes through another tube 15b into chamber 10. Other gases (e.g., $N_2$) may also be introduced into chamber 10 through a pair of one-way valves V immediately prior to the silicon nitride deposition in order to initialize the state of chamber 10.

Also included in the FIG. 1 system is a control signal generator 16 having leads 16a and 16b which respectively couple to mass flow controllers 14a and 14b. In operation, generator 16 sends control signals on the leads 16a and 16b which control the time sequence and rate at which the gases $NH_3$ and $SiH_4$ respectively pass through mass flow controllers 14a and 14b.

Further included in the FIG. 1 system is a pump 17 which removes the gases from chamber 10. Pump 17 couples to end 10b of chamber 10 via tube 18. A barometer 19 and a filter 20 also couple to the tube 18 to respectively measure the pressure of the gas in chamber 10 and filter the gas from chamber 10.

In one actual silicon nitride deposition process, the $NH_3$ gas is passed through chamber 10 at 100cc per minute while the $SiH_4$ gas is passed through chamber 10 at 20cc per minute. During this process, the temperature of tube 10 is held at 800° C. and the pressure within tube 10 is held at 350 millitorr ±50.

With the above process, silicon nitride is deposited on a batch of wafers 12 at a rate of about 36Å per minute. Thus, to deposit a 1000Å film on the wafers, the process is carried out for about 35 minutes. After the deposition process is complete, all of the batch of wafers 12 are removed from chamber 10 through end 10a. Then one or more boats of new wafers 12 are placed in chamber 10 through end 10a and the deposition process is repeated on this new batch.

However, each time that a silicon nitride film is deposited on a batch of wafers, silicon nitride is also deposited on the internal walls of chamber 10. This silicon nitride layer builds up and continues to increase in thickness from one batch of wafers to the next. So after a predetermined number of batches have been processed, steps must be taken to clean the internal walls of the chamber before additional batches of wafers can be processed.

In the prior art, a standard practice has been to clean the walls of the deposition chamber 10 by immersing the chamber in an acid solution. One such solution was a 2:1 mixture of HF and $HNO_3$. After the acid solution had etched the silicon nitride from the internal chamber walls (e.g., after 10–30 minutes), the chamber was rinsed in water and was dried. Then the chamber was used to deposit silicon nitride on additional batches of wafers 12 as described above.

A problem, however, with etching silicon nitride from the internal walls of chamber 10 with an acid solution is that the walls of the chamber deteriorate in the solution. In a deposition chamber that has never been used, the internal walls are polished and shiny; but after an acid etch, the internal walls are frosted. This is because chamber 10 is made of quartz. Both quartz and silicon nitride contain silicon; and an acid which attacks silicon in the silicon nitride film also attacks silicon in the quartz chamber.

Once the surface of a quartz chamber has been acid etched and given a frosted look, microscopic particles of the internal walls of the chamber break off during a silicon nitride deposition process. These particles land on the wafers 12 and become integrated into the silicon nitride film. Each particle then becomes a structural defect in the film since it makes the film non-uniform in texture and produces pinholes. Additional details on these defects are described in conjunction with FIGS. 3 thru 6.

Figure 2:
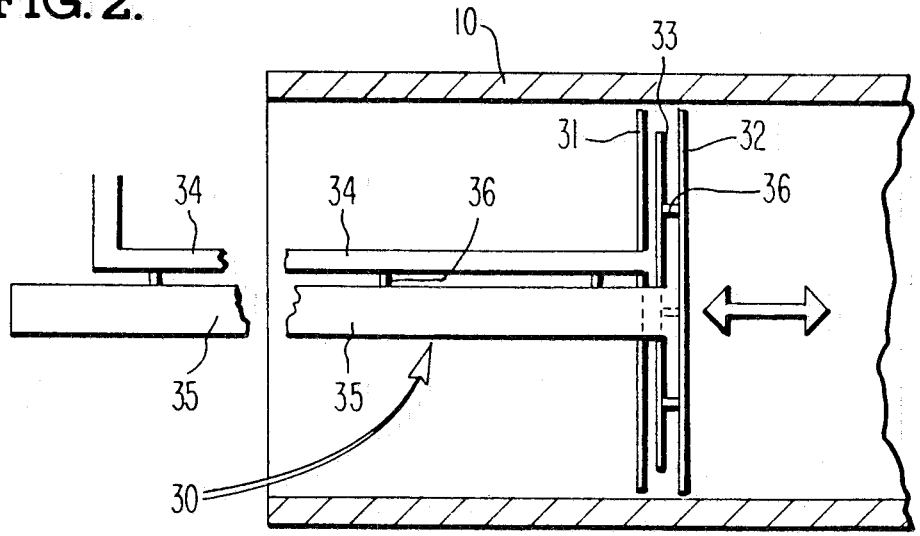
FIG. 2 illustrates an apparatus and process by which silicon films are removed from the internal walls of a chamber 10 in FIG. 1 in accordance with the present invention.

First, however, reference should be made to FIG. 2 which illustrates the process by which silicon nitride is removed from the internal walls of chamber 10 in accordance with the present invention. This process utilizes a gas broom 30 which is made of three disk-shaped plates 31, 32 and 33, a pair of cylindrical tubes 34 and 35, and a plurality of spacers 36, all of which are interconnected as illustrated.

Disks 31 and 32 have a diameter which is one-quarter inch less than the diameter of chamber 10, while disk 33 has a diameter which is one-quarter to one-half inch less than the diameter of chamber 10. Disk 33 has a central aperture and the right end of tube 35 attaches to the aperture's sidewalls.

Disk 31 also has a central aperture. Tube 35 fits through that aperture and attaches to the sidewalls of it such that disk 31 lies to the left of disk 33 by about one-quarter inch. Disk 31 also has another aperture into which tube 34 fits and attaches to its sidewalls. Tubes 34 and 35 are held about one-quarter inch apart by several of the spacers 36. No aperture is in disk 32. It is spaced about one-quarter inch to the right of disk 33 and held in place by three of the spacers 36.

Preferably, all of the components 31–36 are made of quartz and are interconnected together by a glass weld. In such a weld, two glass components are interconnected by temporarily melting the glass with a torch in the area where they interconnect. Then the glass is resolidified and fused together. In one constructed embodiment, plates 31, 32 and 33 are one-eighth inch thick; tube 34 has a three-eighths inch diameter and is sixty-eight inches long; and tube 35 has a three-quarter inch diameter and is seventy-two inches long.

In operation, an inert gas (such as nitrogen) is passed under pressure through tube 34 and emitted from the space between plates 31 and 33. By this means, a forceful stream of gas is directed substantially perpendicular to the internal walls of chamber 10. Preferably, this gas is under a pressure of 25–40 psi.

As the gas is emitted, it strikes the silicon nitride that is deposited on the internal walls of chamber 10 and knocks microscopic particles of the silicon nitride from the internal walls. These particles along with the nitrogen gas are removed from chamber 10 by applying a vacuum to the left end of tube 35. Thus the particles and the nitrogen gas pass through the space between plates 32 and 33 and out tube 35.

Tube 35 also acts as a handle by which the plates 31–33 are moved within chamber 10. All of the silicon nitride on the internal walls of chamber 10 can be removed by slowly moving the plates 31–32 back and forth in the chamber over a time interval of about five minutes. During this movement, the nitrogen gas that is emitted from between plates 31 and 33 has a cushioning effect which helps to prevent the plates from scratching the internal walls.

After the silicon nitride has been removed from chamber 10 by means of the above steps, the chamber is reused in the system of FIG. 1 to deposit silicon nitride on additional batches of wafers with no intervening acid etch of the internal walls. When this silicon nitride removal process is used in conjunction with the previously described silicon nitride deposition process, about twenty-five hours of deposition can occur between cleanings or 1000Å films can be grown on about forty batches of wafers.

Figure 3:
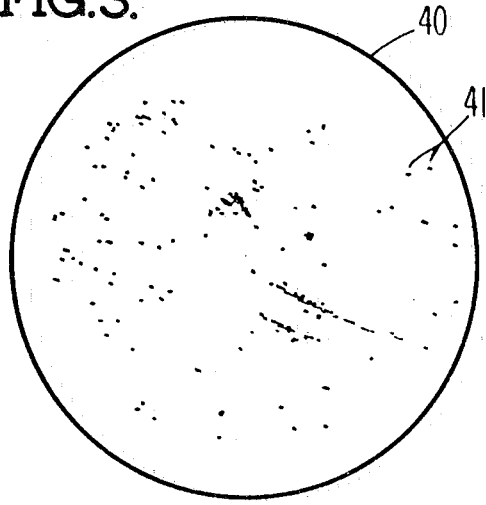
FIG. 3 illustrates a laser beam detection pattern of structural imperfections in a silicon film that was fabricated according to the prior art.
Figure 4:
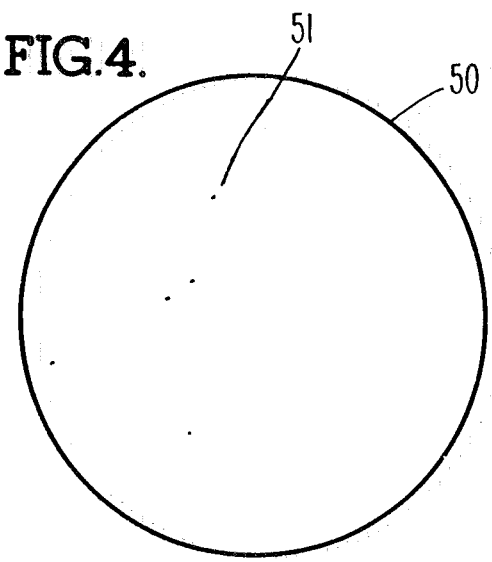
FIG. 4 illustrates a laser beam detection pattern of structural imperfections in a silicon film that was fabricated according to the present invention.

Turning now to FIGS. 3 and 4, the degree to which structural defects in silicon nitride films are reduced by the disclosed process can be graphically seen. Both of these figures are obtained by scanning the surface of a wafer in a raster-like fashion with a narrow laser beam. This beam is directed against the surface at a predetermined angle; and if the surface is flat where the beam hits, then the beam will be reflected from the surface at the same angle. However, if the surface is not flat, then the beam will reflect at some other angle.

Reference numeral 40 in FIG. 4 indicates a wafer that was scanned by the laser beam after the wafer had been processed in a chamber 10 from which silicon nitride film had just been removed with an acid etch of HF and $HNO_3$. Also in that figure, each of the black spots 41 indicates a point at which the laser beam detected that the wafer surface was not flat. These black spots are caused by microscopic particles of the internal walls of chamber 10 being deposited in the film. Over one hundred of these particles are in the film.

By comparison, reference numeral 50 in FIG. 4 indicates a wafer which has been scanned by a laser beam after the wafer was processed in a chamber 10 from which silicon nitride has just been removed by the process of FIG. 2. Also in that figure, the dark spots 51 indicate the points at which the laser beam detected that the surface of the wafer was not flat. This figure contains only five such points.

Figure 5:
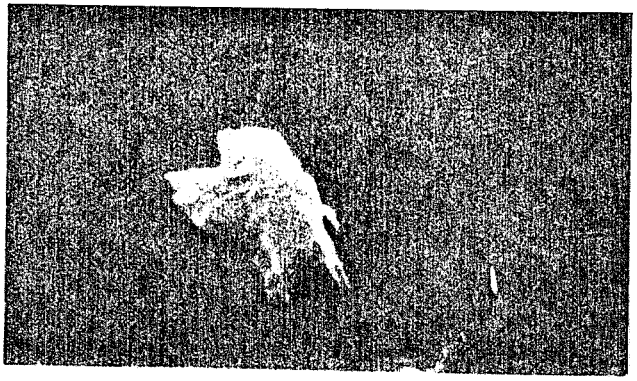
FIG. 5 is a microphotograph taken by an electron microscope of a particle which causes the imperfections in FIGS. 3 and 4.

A greatly enlarged picture of one of the microscopic particles that fall from the internal walls of chamber 10 after it has been acid etched is illustrated in FIG. 5. This picture was taken by an electron microscope. All such particles are random in shape; and typically their maximum dimension is less than one micron. For the particle of FIG. 5, the maximum dimension is about 5000Å.

Figure 6:
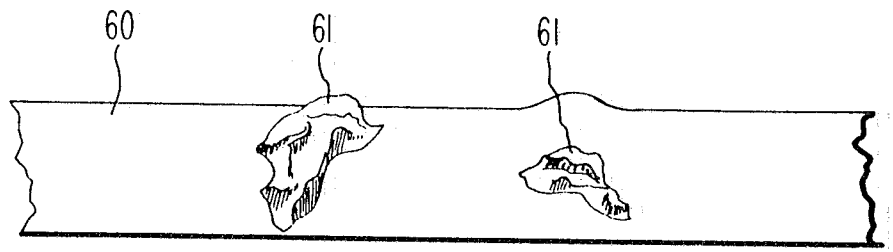
FIG. 6 is a schematic cross-sectional diagram showing how the particle of FIG. 5 is integrated into the films of FIGS. 3 and 4.

A schematic cross-sectional view of a silicon nitride film in which particles such as those of FIG. 5 are imbedded is shown in FIG. 6. There, reference numeral 60 indicates the silicon nitride portion of the film which reference numeral 61 indicates the imbedded quartz particles. Depending upon the relative size of the particles and the thickness of the silicon nitride, the particles may either protrude through the silicon nitride or be completely covered by it. In either case, the surface of the wafer where a particle exists is not flat and so its presence is detected by the laser beam scan of FIGS. 3 and 4.

A major problem with having the quartz particles 61 imbedded in the silicon nitride 60 is that the particles cause pinholes through the film. These pinholes can be detected by immersing the film and the wafer on which the film is deposited into a solution of methyl alcohol and by applying a voltage across the film.

A pure 1000Å thick silicon nitride film having no quartz particles imbedded therein will not conduct when a voltage of 100 volts is applied across it. But if the quartz particles 61 are imbedded in the film, conduction will occur through the film at the points where the quartz particles exist when a voltage of only 20 volts is applied across the film. This conduction is indicated by the presence of bubbles in the methyl alcohol where each pinhole exists.

When 1000Å silicon nitride films are deposited on wafers in accordance with the present invention, the number of pinholes that are detected at 100 volts is less than one per square centimeter. By comparison, when 1000Å silicon nitride films are deposited on a wafer in a chamber that has been acid etched, the number of pinholes that are detected is typically 13-38 per square centimeter at just 20 volts.

Such pinholes are catastrophic if the silicon nitride film is used in an integrated circuit to insulate two conductive layers from each other. Further, the presence of such pinholes can be catastrophic where the silicon nitride film is used in an integrated circuit as a mask for a selective ion implant or a mask for a selective oxidation step.

A preferred method of depositing silicon nitride films on integrated circuit wafers in mass production with reduced structural defects in accordance with the invention has now been described in detail. In addition, however, various changes and modifications can be made to these details without departing from the nature and spirit of the invention. For example, the disclosed method may be modified to deposit polycrystalline silicon films on a wafer in mass production.

In such a process, $SiH_4$ but not $NH_3$ is passed through chamber 10 via the apparatus of FIG. 1. Suitably, the $SiH_4$ is passed through chamber 10 at a pressure of $340\pm20$ millitorr and a temperature of $590\pm10°$ C. for a time duration of $114\pm20$ minutes. Additional batches of wafers are processed in the same fashion until the buildup of the polycrystalline silicon on the internal walls of chamber 10 is too thick. Then, the apparatus and process of FIG. 2 is used to remove polycrystalline silicon from the internal walls of chamber 10. Thereafter, the deposition of polycrystalline silicon on additional batches of wafers can continue without any intervening acid etch of the internal walls of chamber 10.

Accordingly, since many such changes can be made to the above disclosed details, it is to be understood that the invention is not limited to such details but is defined by the appended claims.

What is claimed is:

1. A method of mass producing defect-free films of a silicon substance on integrated circuit wafers in a quartz chamber including the steps of:
    passing a reactant gas which contains silicon over a batch of said wafers in said quartz chamber to deposit said silicon substance on both said wafers and the quartz walls of said chamber;
    repeating said passing step on other batches of wafers until the thickness of said silicon substance on said quartz walls exceeds a predetermined limit;
    directing a forceful stream of gas against said quartz walls to knock microscopic particles of said silicon substance therefrom;
    removing said knocked-off microscopic particles from said chamber; and
    continuing said passing and repeating steps with no intervening acid etch of said silicon substance on said quartz walls.

2. A method according to claim 1 wherein said reactant gas is passed through said chamber for a total of at least 25 hours prior to said directing and removing steps.

3. A method according to claim 1 wherein said forceful stream of gas is directed against said walls at a pressure of 25 to 45 psi.

4. A method according to claim 1 wherein said forceful stream of gas is directed substantially perpendicular to said walls.

5. A method according to claim 1 wherein said reactant gas is passed over said wafers at a flow rate of les than 40cc/sec.

6. A method according to claim 1 wherein said particles are removed from said chamber by applying a vacuum near the region of said walls to which said forceful stream of ga is directed.

7. A method according to claim 1 wherein said substance that is deposited on said wafers and on said quartz walls is silicon nitride.

8. A method according to claim 1 wherein said substance that is deposited on said wafers and on said quartz walls is polysilicon.

9. A method according to claim 1 wherein said forceful stream of gas is emitted fromm an aperture that is formed by two spaced apart disks that are slightly smaller than the cross-sectional shape of said chamber.

10. A method according to claim 1 wherein said forceful stream of gas is emitted from a first aperture while a vacuum is applied to a second aperture which apertures are formed by three spaced apart disks that are slightly smaller than the cross-sectional shape of said chamber.

11. A method of depositing silicon films on integrated circuit wafers in mass production with improved structural uniformity including the steps of: passing a gas which contains silicon over multiple batches of said wafers in a quartz chamber to deposit respective layers of silicon substance on said wafers while also building up a layer of said silicon substance on the internal quartz walls of said chamber; interrupting said passing step to direct a forceful stream of gas against said internal quartz walls to knock microscopic particles of said silicon substance therefrom; removing said knocked-off microscopic particles from said chamber; and continuing said passing step.

* * * * *